United States Patent [19]

Wells, III

[11] Patent Number: 4,971,563
[45] Date of Patent: Nov. 20, 1990

[54] MODULAR BACKPLANE ASSEMBLIES FOR COMPUTERS

[76] Inventor: William M. Wells, III, 3243 Sunset Blvd., West Columbia, S.C. 29169

[21] Appl. No.: 386,502

[22] Filed: Jul. 27, 1989

[51] Int. Cl.$^5$ .............................................. H01R 9/09
[52] U.S. Cl. ..................................... 439/61; 361/413
[58] Field of Search ....................... 439/59, 61, 64, 74, 439/76, 78, 79; 361/394, 399, 413, 415

[56] References Cited

U.S. PATENT DOCUMENTS

| | | | |
|---|---|---|---|
| 4,744,006 | 5/1988 | Duffield | 361/413 |
| 4,745,524 | 5/1988 | Patton, III | 361/399 |
| 4,838,798 | 6/1989 | Evans et al. | 439/61 |

FOREIGN PATENT DOCUMENTS 0770280  10/1967  Canada ................................ 361/413

Primary Examiner—Neil Abrams
Assistant Examiner—Khiem Nguyen
Attorney, Agent, or Firm—Rhodes, Coats & Bennett

[57] ABSTRACT

This invention relates to computers, and particularly to the accommodation of accessory cards of varying types through the provision of modular backplane assemblies. By way of example, the invention contemplates, in a computer apparatus having a main chassis for mounting a motherboard and defining a backplane portion for enclosing and shielding components mounted for electrical connection with the motherboard and an opening in the backplane portion for providing access for connections to peripheral devices, an improvement which facilitates adaptation of the apparatus to mounting accessory boards having at least two differing predetermined types of electrical interconnection hardware and mechanical mountings. The improvement comprises at least two interchangeable modular backplane assemblies, each assembly having the capability of removably fitting into the main chassis and receiving and electrically connecting with and mechanically securing accessory cards of a corresponding type.

5 Claims, 4 Drawing Sheets

MODULAR BACKPLANE ASSEMBLIES FOR COMPUTERS

FIELD AND BACKGROUND OF INVENTION

This invention relates to computers, and particularly to the accommodation of computers and microcomputers to accessory cards of varying types through the provision of modular backplane assemblies.

As used in this description, "microcomputer" means that type of small computer apparatus which has come into general use in businesses and homes and in which a main processor or central processing unit (CPU) is housed in a cabinet of a size suitable for placing on or beside a desk or workstation and for accommodating accessory cards such as monitor display drivers, magnetic memory disk drivers, serial or parallel or game ports, and the like. Persons knowledgeable about computers generally will be familiar with microcomputers and the IBM standard which has been widely adopted by makers of so-called "clones" of the IBM models known as the PC, XT and AT machines.

The recent development of technology for microcomputers, including developments by IBM, the originator of a standard which has been widely adopted, has been such that there are proposals for several differing systems of accessory card connection and mounting. Two examples are the prior IBM standard which has been widely adopted and the more recent IBM development known as microchannel architecture (MCA).

It has been the industry practice to provide a computer which is capable of accepting accessory cards designed and built to be accepted in one system and not in others. That is, a machine constructed to accommodate accessory cards constructed to the prior standard is incapable of accepting cards constructed to the MCA standard, and vice versa. Thus a user is faced with a basic choice in selecting a machine and any prior assortment of accessory cards must be discarded and replaced if a change is made from one system to the other.

Such choices are not limited to microcomputers. Similar architectural choices must be made for computers generally, as is known to persons skilled in the applicable arts.

BRIEF STATEMENT OF INVENTION

With the foregoing in mind, it is an object of this invention to provide a user of a computer with the capability of mounting accessory cards of a variety of types in, and using such cards with, a computer. In realizing this object of the present invention, a user is freed from any necessity of discarding and replacing accessory cards where a decision is made to change types of computers, and cards initially designed for one system may be adapted for use with another.

Yet a further object of this invention is to accomplish the adaptation of a computer to the use of accessory cards of varying types while maintaining both shielding of components housed within a main chassis and access to the accessory cards for external peripheral devices such as monitors and printers. In realizing this object of the present invention, modular subassemblies are provided which cooperate with a main chassis of a computer in such as way as to facilitate conversion among a plurality of types of accessory card mountings.

BRIEF DESCRIPTION OF DRAWINGS

Some of the objects of the invention having been stated, other objects will appear as the description proceeds, when taken in connection with the accompanying drawings, in which.

DETAILED DESCRIPTION OF INVENTION

While the present invention will be described more fully hereinafter with reference to the accompanying drawings, in which a preferred embodiment of the present invention is shown, it is to be understood at the outset of the description which follows that persons of skill in the appropriate arts may modify the invention here described while still achieving the favorable results of this invention. Accordingly, the description which follows is to be understood as being a broad, teaching disclosure directed to persons of skill in the appropriate arts, and not as limiting upon the present invention.

Referring now more particularly to the accompanying drawings, the present invention is there shown in one particular environment as illustrated from working embodiments of the invention which have been produced. However, it is known that the invention may be embodied in alternative forms.

Figure 1:
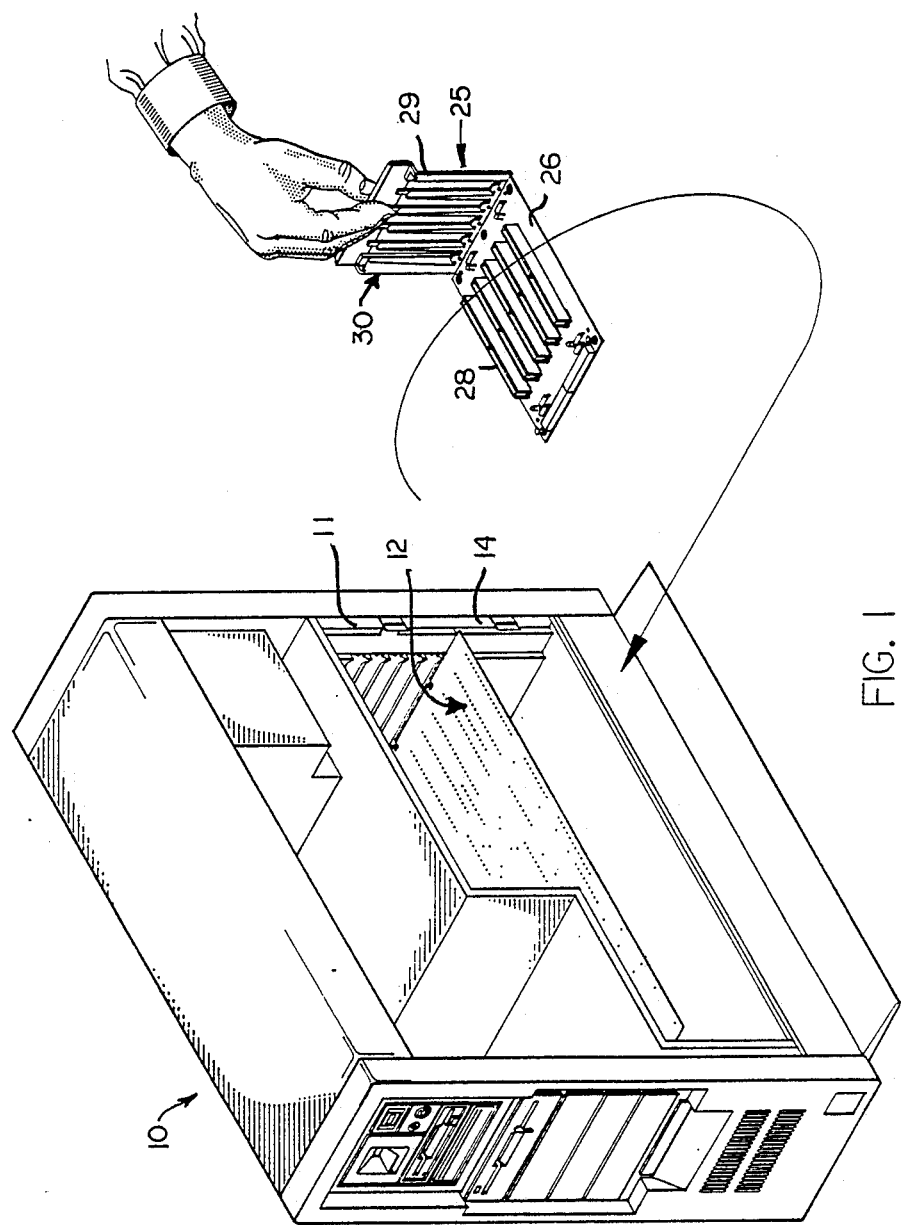
FIG. 1 is a perspective view of a computer embodying the present invention and illustrating the installation of a modular backplane assembly.
Figure 5:
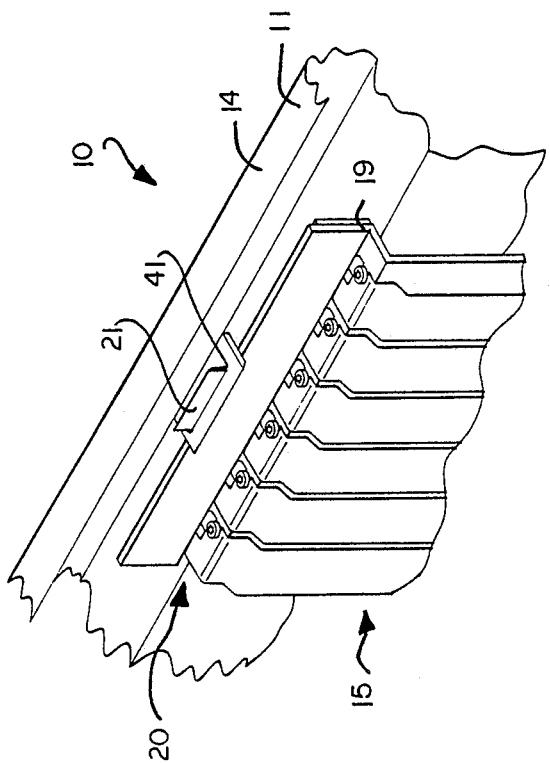
FIG. 5 is an enlarged scale perspective view of the assembled modular backplane assembly and computer of FIG. 4, particularly illustrating the engagement of mechanical coupling portions provided thereon.
Figure 4:
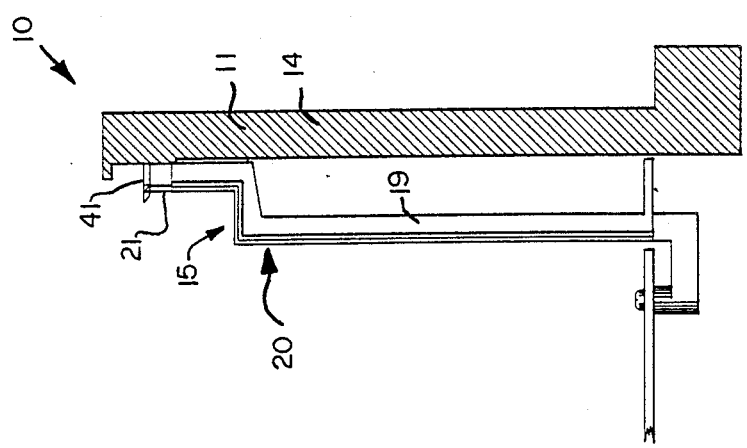
FIG. 4 is an enlarged scale elevation view, partly in section, of a modular backplane assembly of the type of FIG. 2 as assembled with the computer of FIG. 1.

In FIGS. 1, 4 and 5, a microcomputer is shown and indicated at 10 which has a "tower" case of somewhat conventional appearance and includes a main chassis 11. The main chassis 11 serves a number of purposes, including housing and supporting a motherboard 12 and providing electrical shielding for components of the computer 10 while permitting connection of external peripherals devices such as monitors and printers to the computer. A portion 14 of the chassis (to the right in FIG. 1) defines a backplane portion for enclosing and shielding components mounted for electrical connection with the motherboard and an opening in the backplane portion 14 for providing access for connections to peripheral devices.

In accordance with important objectives of this invention, an improvement is provided which facilitates adaptation of the apparatus to mounting accessory boards having at least two differing predetermined types of electrical interconnection hardware and mechanical mountings. The improvement comprises, most broadly stated, a set of interchangeable assemblies, each of which is configured to accept and mount accessory cards of a corresponding type.

By way of background, IBM compatible personal computers made for many years after about 1982 used a form of open architecture which, although originated by IBM, became an industry standard and was widely adopted by a large number of companies making and selling accessory cards for such computers. That standard provided for a particular type of mechanical connection which provided both support and shielding while permitting electrical access to circuitry mounted on a printed circuit card. The standard also provided for electrical connection between a motherboard and circuitry on the accessory card by means of electrical connection hardware which engaged an edge of a printed circuit card forming a portion of the accessory card. The mechanical and electrical connectors became standardized and widely used within the computer industry. At a later date, IBM created and adopted a different form of open architecture for machine using a system known by the IBM trademarks "Microchannel" or "MCA". That architecture, while differing electrical and mechanical connectors. Accessory cards made for one architecture are unusable with a machine configured only for the other architecture. It is an important objective of this invention to permit use in a single machine of accessory cards made for either or both systems.

Figure 2:
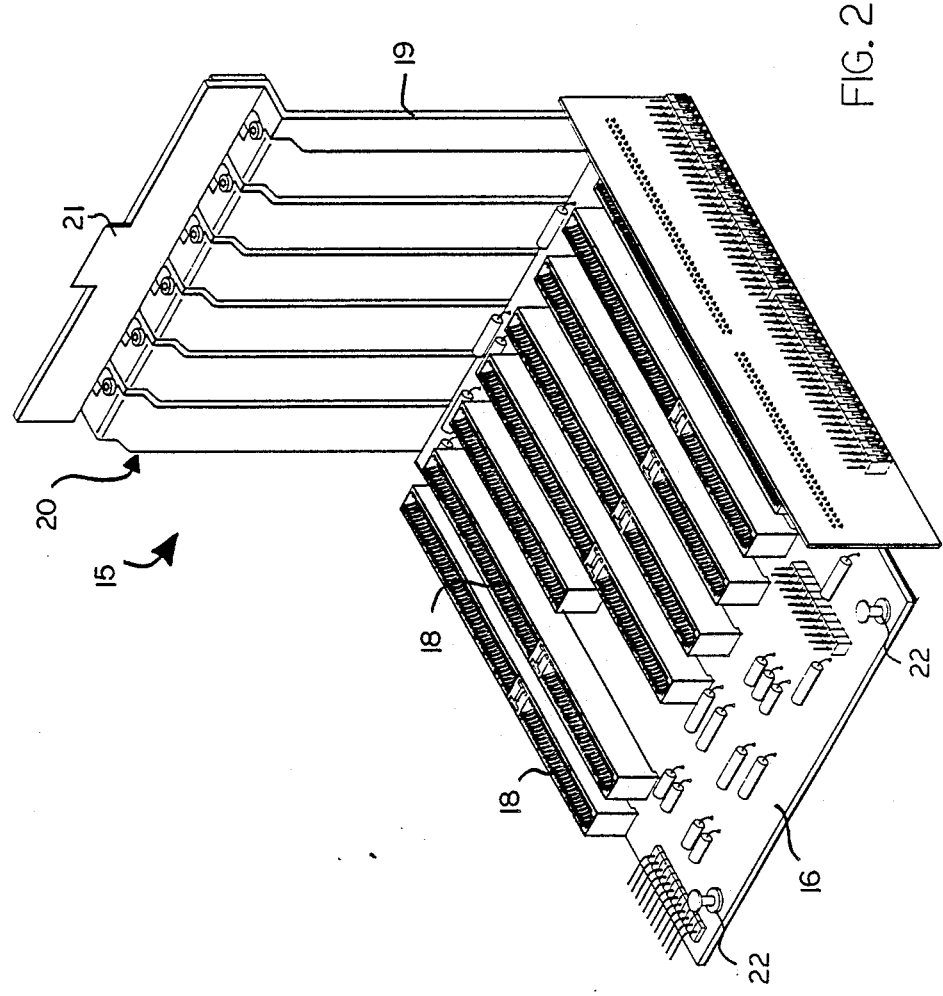
FIG. 2 is an enlarged scale perspective view of a first type of modular backplane assembly in accordance with this invention.
Figure 3:
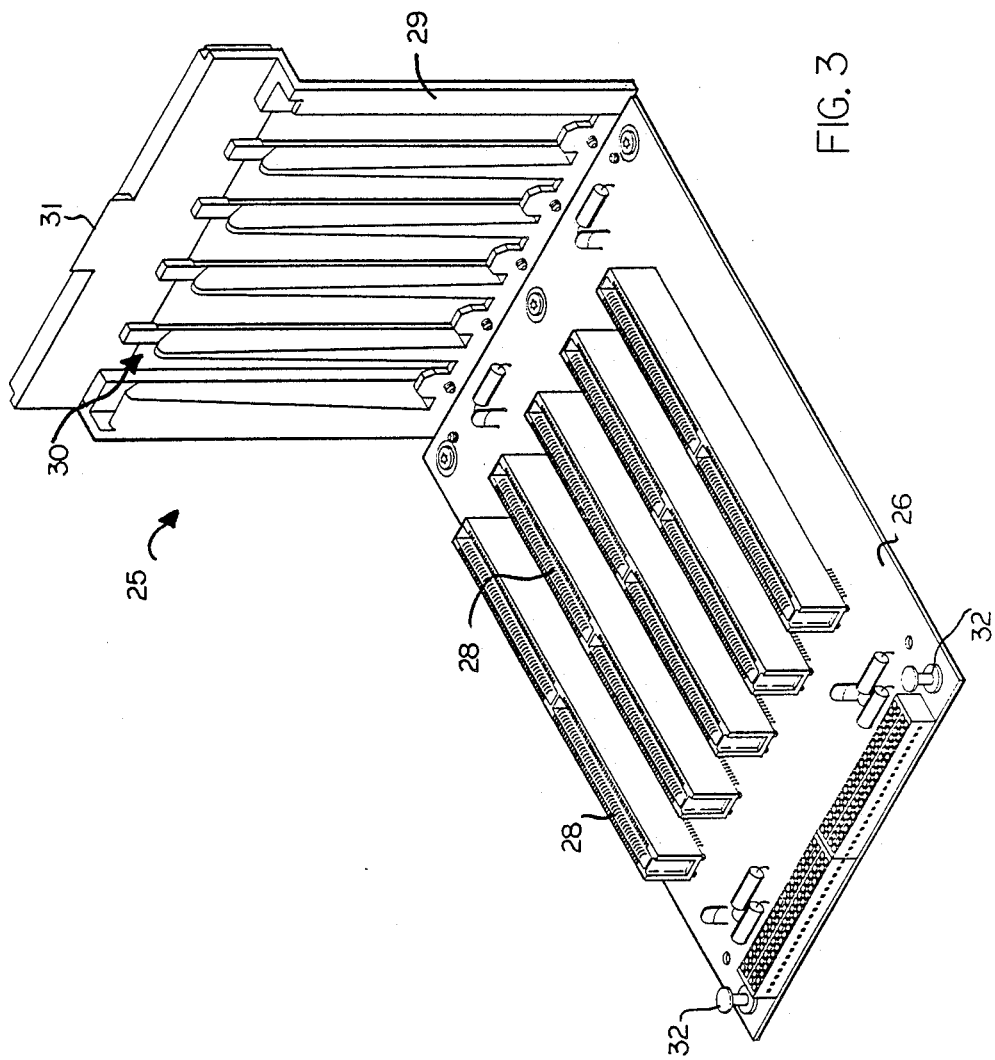
FIG. 3 is a view similar to FIG. 2 showing a second type of modular backplane assembly.

This is accomplished, in this invention, by the provision of at least two interchangeable modular backplane assemblies 15 and 25, shown respectively in FIGS. 2, 4 and 5 for one type and FIGS. 1 and 3 for the other. This invention contemplates that still other types of modular backplane assemblies, not shown here or even yet conceived, may use the teachings of this invention. Further, this invention contemplates that the principles here described and illustrated may be used with types of computers and main chassis assemblies not shown here or even yet conceived.

Each of the two types of assemblies 15, 25 has a planar printed circuit board (respectively shown at 16, 26), electrical interconnection hardware means mounted on the corresponding circuit board 16, 26 for receiving accessory boards of one predetermined type and establishing electrical connection therewith (shown respectively at 18, 28), a generally planar chassis closure member affixed to the corresponding circuit board 18, 28 with the principal plane thereof perpendicular to the principal plane of the corresponding circuit board (respectively shown at 19, 29), and mechanical mounting means borne by the corresponding chassis closure member 19, 29 for receiving accessory boards of the corresponding one predetermined type and securing the same mechanically in place in the modular backplane assembly and positioned for electrical connection with the hardware means (respectively indicated at 20, 30). The electrical interconnection hardware 18, 28 and the mechanical mounts 20, 30 cooperate for positioning an accessory board with a principal plane thereof perpendicular to the principal planes of both of the corresponding circuit board 16, 26 and chassis closure member 19, 29. Preferably, and as illustrated particularly in FIGS. 2 and 3, each assembly 15, 25 is configured for receiving and electrically connecting with and mechanically mounting a plurality of accessory boards of the corresponding one predetermined type. In the forms illustrated, the assembly of FIG. 2 mounts accessory cards of the older standard, while that of FIG. 3 mounts those of the newer standard to which specific reference has been made.

Each of the main chassis 11 and the assemblies 19, 29 has mating connector means on the backplane portion 14 of the main chassis 11 and the modular backplane assemblies 15, 25 for removably joining a selected one of the assemblies to the chassis 11 and for positioning the selected assembly with the closure member thereof closing the opening in the backplane portion of the chassis for completing shielding of components mounted on the modular backplane assembly. In the form illustrated, the mating connector means include a tongue 21, 31 on the closure members 19, 29 which is received in a slot 41 in the main chassis backplane portion 14 and a pair of snap plunger fasteners 22, 32 which couple with sockets provided in the main chassis 11.

As suggested in FIG. 1, the modular backplane assemblies 15, 25 of this invention may be easily manipulated for insertion into or removal from the computer 10. Once inserted and secured, appropriate electrical connections may be made by flat cable connectors of known types to establish connection between the motherboard 12 and the modular backplane assemblies, and thence with any accessory cards mounted thereon.

In the drawings and specifications there has been set forth a preferred embodiment of the invention and, although specific terms are used, the description thus given uses terminology in a generic and descriptive sense only and not for purposes of limitation.

What is claimed is:

1. In a computer apparatus having a main chassis for mounting a motherboard and defining a backplane portion for enclosing and shielding components mounted for electrical connection with the motherboard and an opening in said backplane portion for providing access for connections to peripheral devices, an improvement which facilitates adaptation of the apparatus to mounting accessory boards having at least two differing predetermined types of electrical interconnection hardware and mechanical mountings, the improvement comprising at least two interchangeable modular backplane assemblies, each assembly having:

a planar printed circuit board, electrical interconnection hardware means mounted on said circuit board for receiving accessory boards of one predetermined type and establishing electrical connection therewith, a generally planar chassis closure member affixed to said circuit board with the principal plane thereof perpendicular to the principal plane of said circuit board, mechanical mounting means borne by said chassis closure member for receiving accessory boards of said one predetermined type and securing the same mechanically in place in said modular backplane assembly and positioned for electrical connection with said hardware means, and mating connector means on said backplane portion of said main chassis and said modular backplane assembly for removably joining said assembly to said chassis and for positioning said assembly with said closure member closing said opening in said backplane portion of said chassis for completing shielding of components mounted on said modular backplane assembly.

2. In a computer apparatus having a main chassis for mounting a motherboard and defining a backplane portion for enclosing and shielding components mounted for electrical connection with the motherboard and an opening in said backplane portion for providing access for connections to peripheral devices, an improvement which facilitates adaptation of the apparatus to mounting accessory boards having at least two differing predetermined types of electrical interconnection hardware and mechanical mountings, the improvement comprising a modular backplane assembly having:

a planar printed circuit board, electrical interconnection hardware means mounted on said circuit board for receiving accessory boards of a predetermined type and establishing electrical connection therewith, chassis closure member affixed a generally planar to said circuit board with the principal plane thereof perpendicular to the principal plane of said circuit board, mechanical mounting means borne by said chassis closure member for receiving accessory boards of said predetermined type and securing the same mechanically in place in said modular backplane assembly and positioned for electrical connection with said hardware means, and mating connector means on said backplane portion of said main chassis and said modular backplane portion of said main chassis and said modular backplane assembly for removably joining said assembly to said chassis and for positioning said assembly with said closure member closing said opening in said backplane portion of said chassis for completing shielding of components mounted on said modular backplane assembly.

3. A modular backplane assembly for a computer comprising:

a planar printed circuit board, electrical interconnection hardware means mounted on said circuit board for receiving accessory boards of a predetermined type and establishing electrical connections therewith, a generally planar chassis closure member affixed to said circuit board with the principal plane thereof perpendicular to the principal plane of said circuit board, mechanical mounting means borne by said chassis closure member for receiving accessory boards of said predetermined type and securing the same mechanically in place in said modular backplane assembly and positioned for electrical connection with said hardware means, and mating connector means for removably joining said modular backplane assembly to a computer chassis and for positioning said assembly in the computer chassis, with said closure member closing an opening in a backplane portion of the chassis for completing shielding of components mounted on said modular backplane assembly.

4. Apparatus according to one of claims 1 or 2 or 3 wherein said electrical interconnection hardware means and said mechanical mounting means cooperate for positioning an accessory board with a principal plane thereof perpendicular to the principal planes of both of said circuit board and said chassis closure member.

5. Apparatus according to one of claims 1 or 2 or 3 wherein said assembly is configured for receiving and electrically connecting with and mechanically mounting a plurality of accessory boards of one predetermined type.

* * * * *